United States Patent [19]

Tanaka et al.

[11] Patent Number: 5,408,438
[45] Date of Patent: Apr. 18, 1995

[54] SEMICONDUCTOR MEMORY

[75] Inventors: Isao Tanaka; Tsuguyasu Hatsuda, both of Osaka, Japan

[73] Assignee: Matsushita Electric Industrial Co., Ltd., Osaka, Japan

[21] Appl. No.: 251,403

[22] Filed: May 31, 1994

[30] Foreign Application Priority Data

Jun. 1, 1993 [JP] Japan .................. 5-130338

[51] Int. Cl.$^6$ .............................................. G11C 13/00
[52] U.S. Cl. ...................................... 365/203; 365/233
[58] Field of Search .............. 365/203, 233, 189.01, 365/189.04, 189.05, 189.09, 189.11, 230.03, 233.5

[56] References Cited

U.S. PATENT DOCUMENTS 3,680,061  7/1972  Arbab et al. .
3,849,673  11/1974  Koo ........................ 365/203
4,727,517  2/1988  Ueno et al. .
4,982,365  1/1991  Ohtani et al. .

FOREIGN PATENT DOCUMENTS 60-61986  4/1985  Japan .
4-89690  3/1992  Japan .
4-141887  5/1992  Japan .

Primary Examiner—Terrell W. Fears
Attorney, Agent, or Firm—Willian Brinks Hofer Gilson & Lione

[57] ABSTRACT

Plural memory cells are connected to a common word line. Provided in each memory cell are a bit line pair, a data line pair, a precharge circuit, a switch circuit, a timing control circuit, and a sense amplifier. Each timing control circuit provides a word line control signal and a switch control signal, before the output of the sense amplifier becomes definite and at a point in time when the potential of the bit line pair changes to such an extent that the sense amplifier becomes operable. The switch control signal is applied to a corresponding switch circuit to separate the sense amplifier from the bit line pair. The word line control signal From each timing control circuit is applied to a single OR gate. The output of the OR gate, along with the output of a row decoder, is applied to an AND gate. The AND gate controls the word line for activation. When every word line control signal becomes LOW, the word line is made inactive to separate all the memory cells from the corresponding bit line pairs.

10 Claims, 7 Drawing Sheets

F I G.1
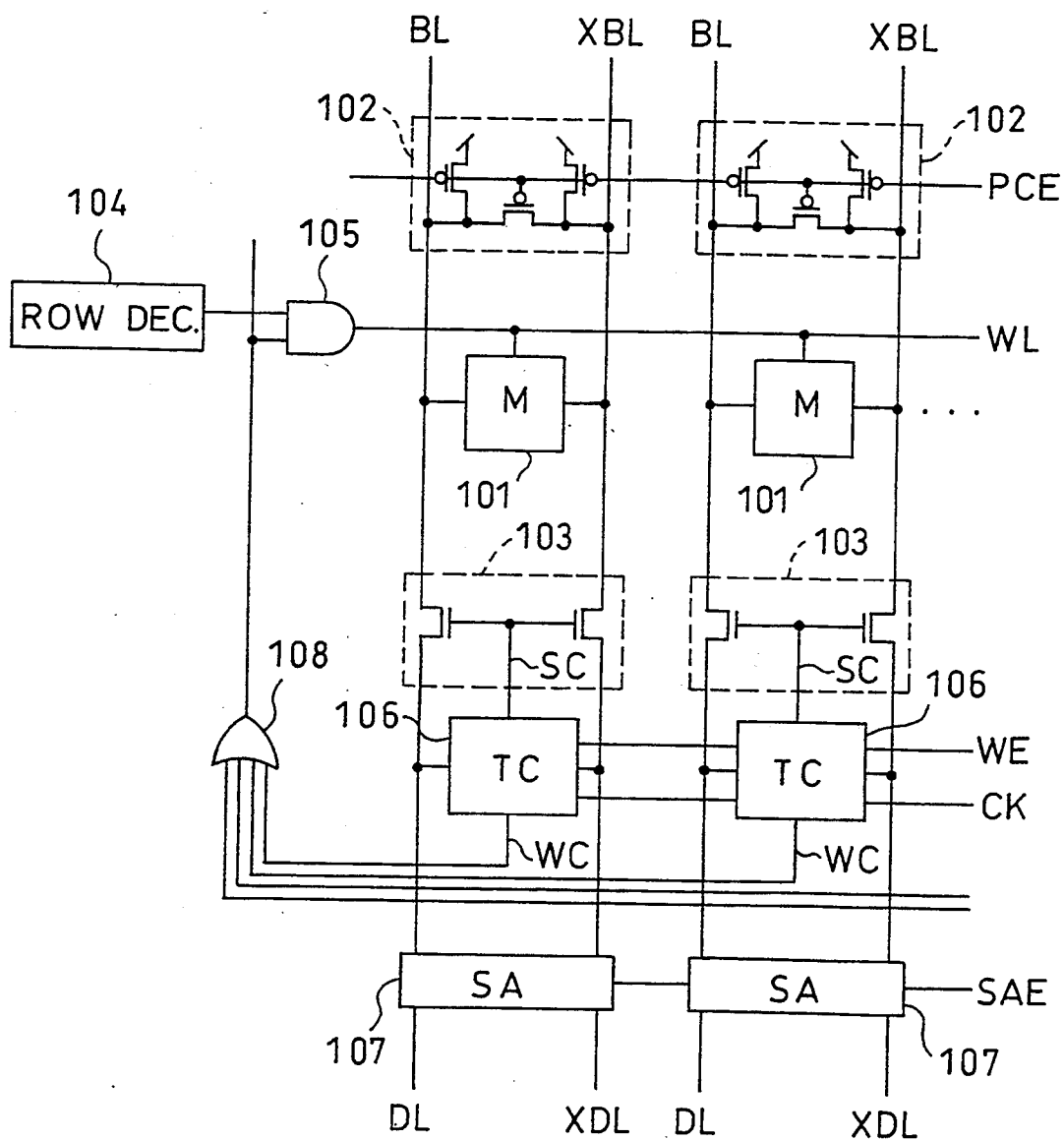

SEMICONDUCTOR MEMORY

TECHNICAL FIELD OF THE INVENTION

This invention relates in general to semiconductor memories, and more particularly to a static random access memory (SRAM).

BACKGROUND OF THE INVENTION

The semiconductor memory industry has been introducing various SRAMs. Of these SRMs an SRAM is known in which a pair of bit lines are precharged to a HIGH level ($V_{dd}$) and a word line is made active to read out a bit of data stored in a memory cell. One of the bit line pair, selected on the basis of the stored data, discharges through the memory cell, thereby creating a difference in potential between the bit line pair. Such a potential difference is amplified by a sense amplifier. If the word line is left active, then the potential of the bit line that is still discharging will keep falling and eventually reach the ground level (zero volt). This is because that electric charges held by the bit line in question keep vanishing. As a result, the potential of the bit line considerably drops, thereby producing the problem that much charging current is required at the next precharge cycle.

Japanese Patent Application, published under No. 60-61986, attempts to offer a solution to the above mentioned problem. In accordance with this technique, a memory cell is separated from a bit line pair by making a word line inactive, before the potential of one bit line drops to the ground level and at a point in time when the output potential of a sense amplifier becomes definite. As a result of such arrangement, the drop in potential becomes controllable and power consumption during the precharge process can be reduced. Establishment of the sense amplifier's output potential is detected by, for example, a sensing circuit with a circuit threshold of $\frac{1}{2} V_{dd}$.

In a CMOS SRAM having a latch-type sense amplifier, amplification operations by such a sense amplifier is permitted to start when the potential of one bit line falls by $V_{tp}$ (i.e., the threshold voltage of a PMOS transistor) from $V_{dd}$. After the potential of the bit line falls below a difference of $V_{dd}-V_{tp}$, the sense amplifier can keep operating even if the memory cell is separated from the bit line pair and the sense amplifier itself is separated from the bit line pair, and the output potential of the sense amplifier becomes definite.

The above-described SRAM, however, suffers from some problems. For instance, in such an SRAM, it is not until the output potential of a sense amplifier becomes definite that a word line becomes inactive. Because of this, the drop in bit line potential cannot be controlled successfully. Another problem is that in some SRAM internal structures the sense amplifier may reduce the bit line potential with high-drive capability. Furthermore, the drop in bit line potential may be caused by all the memory cells belonging to a single row.

SUMMARY OF THE INVENTION

It is therefore an object of the present invention to provide a technique capable of reducing power consumption during the precharge process by controlling the drop in bit line potential.

The present invention discloses a first semiconductor memory. In this semiconductor memory, both a memory cell and a sense amplifier are separated from the bit line pair, before the output potential of the sense amplifier becomes definite and at the latest at a point in time when the potential of one bit line changes to such an extent that the sense amplifier becomes operatable. This organization can stop a bit line from discharging earlier than a conventional organization. This not only effectively controls the drop in bit line potential but also speeds up amplification operations by a sense amplifier.

The present invention discloses a second semiconductor memory. In this semiconductor memory, only a word line within a particular memory block selected by a column address from among a plurality of memory blocks is made active, and precharge is permitted to the bit line pair only when the word line is made active at the most recent access cycle. This arrangement adequately controls undesired drops in the bit line potential and offers a benefit that the operation of precharge can be started early even if the establishment of input address is delayed.

BRIEF DESCRIPTION OF THE DRAWINGS

FIG. 1 schematically shows a first semiconductor memory of the present invention.

DETAILED DESCRIPTION OF The INVENTION

Figure 2:
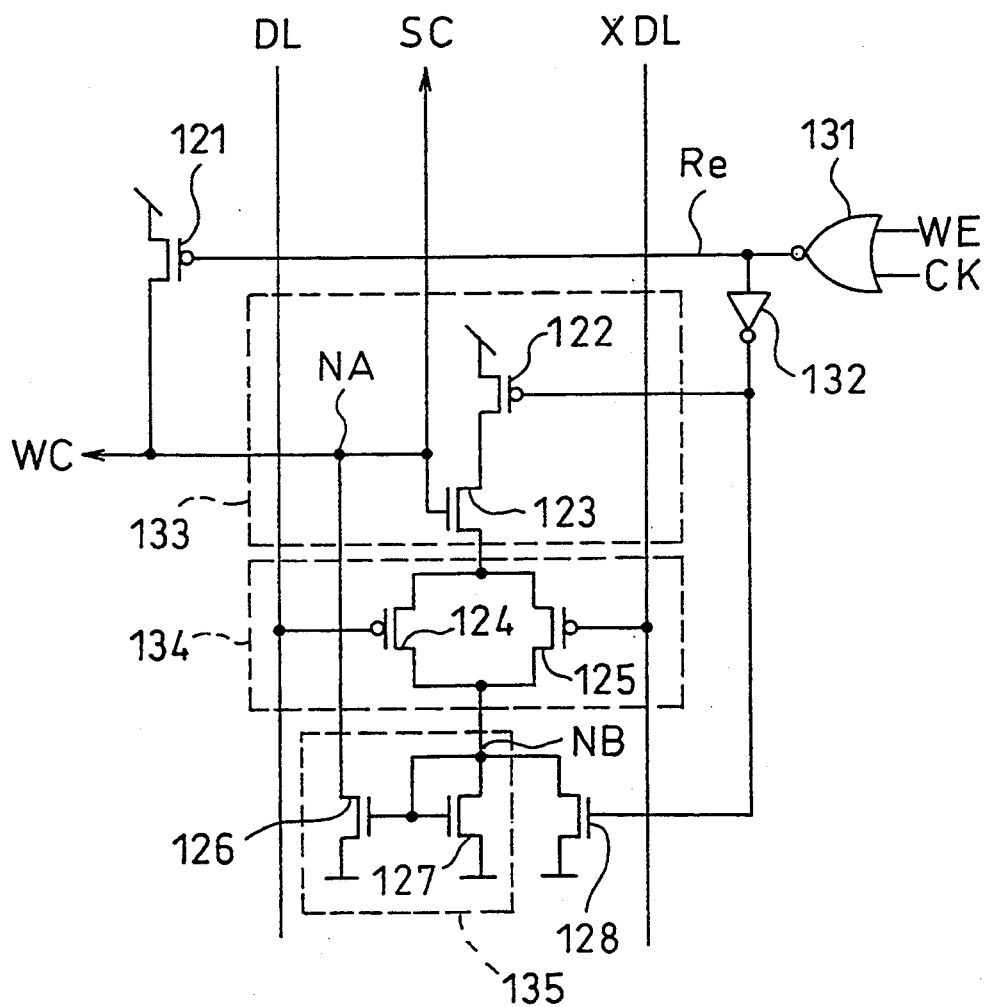
FIG. 2 is a circuit diagram illustrating the internal organization of a timing control circuit of FIG. 1.
Figure 3:
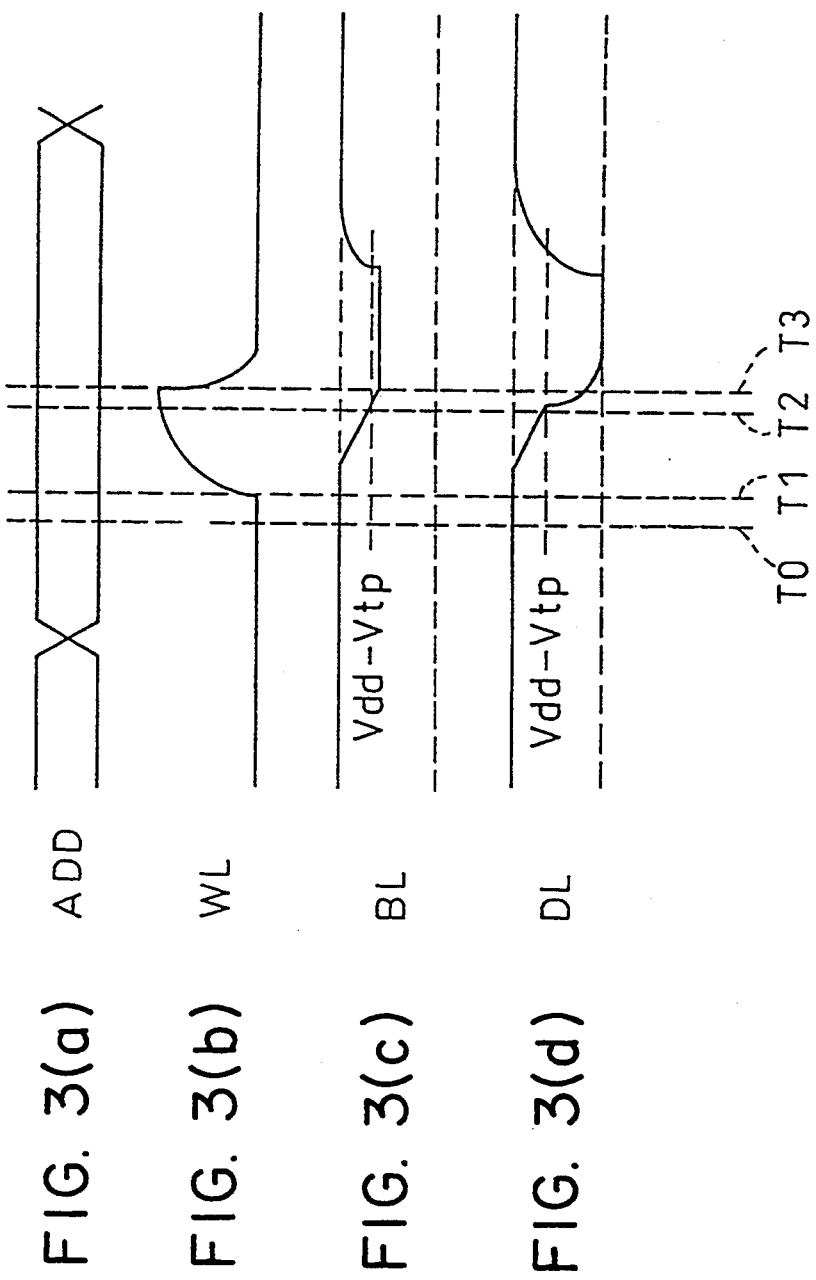
FIG. 3a–3d is a graph showing a series of wave forms depicting the timing sequence of the first semiconductor device of FIG. 1.

Preferred embodiments of the present invention are described by making reference to FIGS. 1–7.

EXAMPLE 1

FIG. 1 is a circuit diagram of a CMOS SRAM of the first embodiment of the present invention. WL indicates a word line. A plurality of memory cells 101 are connected in common to the word line WL. For each memory cell 101, a single column, formed by a bit line pair of bit lines BL and XBL, a data line pair of data lines DL and XDL, a precharge circuit 102, a switch circuit 103, a timing control circuit 106, and a sense amplifier 107, is provided.

In each column, the precharge circuit 102 is formed by three PMOS transistors in order that the bit line pair BL and XBL are precharged to a HIGH level ($V_{dd}$). A precharge enable signal PCE is a signal used to make the precharge circuit 102 active. The switch circuit 103 is formed by two NMOS transistors arranged between BL-DL and XBL-XDL. The sense amplifier 107 is arranged over and across the data line pair DL and XDL so that it can amplify changes in the potential of the bit line pair BL and XBL on the basis of the stored data in the memory cell 101 when the word line WL is made active. The sense amplifier 107 has a latch-type internal organization so that the amplifier 107 can start amplifying when the potential of one bit line decreases by $V_{tp}$ (i.e., the threshold voltage of the PMOS transistor) from $V_{dd}$. A sense amplifier enable signal SAE is a signal used to make the sense amplifier 107 active. The timing control circuit 106 lies between the switch circuit 103 and the sense amplifier 107 and outputs a word line control signal WC and a switch control signal SC, before the output of the sense amplifier 107 becomes definite and at a point in time when the potential of one of the bit line pair BL and XBL changes to such an extent that the sense amplifier 107 becomes operatable. WE indicates a write enable signal and CK a clock signal. The switch control signal SC is applied to the gates of the two NMOS transistors forming the switch circuit 103.

The word line control signal WC from each timing control circuit 106 is applied to a single OR gate 108. The output of the OR gate 108, together with the output of a row decoder 104, is applied to an AND gate 105. The AND gate 105 has an output terminal coupled to the word line WL.

FIG. 2 is a circuit diagram showing the internal organization of the timing control circuit 106. The timing control circuit 106 comprises these elements: a first PMOS transistor 121, a second PMOS transistor 122, a third PMOS transistor 124, a fourth PMOS transistor 125, a first NMOS transistor 123, a second NMOS transistor 126, a third NMOS transistor 127, a fourth NMOS transistor 128, a NOR gate 131, and an inverter 132. The sources of the first and second PMOS transistors 121 and 122 are connected to the power supply ($V_{dd}$). The sources of the second, third and fourth NMOS transistors 126-128 are connected to ground. The gate of the third PMOS transistor 124 is connected to the bit line BL by way of the data line DL. The gate of the fourth PMOS transistor 125 is connected to the bit line XBL by way of the data line XDL.

Both the write enable signal WE and the clock signal CK are applied to the NOR gate 131. In a write operation in which the write enable signal WE is kept HIGH, the output of the NOR gate 131 (i.e., a read control signal Re) is kept LOW. In contrast, in a read operation in which the write enable signal WE is kept LOW, the read control signal Re has a logic level that is the reverse of the logic level of the clock signal CK. The read control signal Re is directly applied to the gate of the first PMOS transistor 121 and then to the gates of the second PMOS transistor 122 and the fourth NMOS transistor 128 via the inverter 132.

The first PMOS transistor 121 forms a first potential set means for initializing the potential of an output node NA of the word line control signal WC and the switch control signal SC to HIGH. The drain of the first PMOS transistor 121, the gate of the first NMOS transistor 123, and the drain of the second NMOS transistor 126 are connected to the output node NA. The second and third NMOS transistors 126 and 127 together form a current mirror 135. The drain and gate of the third NMOS transistor 127 are connected to the gate of the second NMOS transistor to form a current input node NB. The drain of the second NMOS transistor 126 is connected to the output node NA, serving as a current output terminal. The fourth NMOS transistor 128 forms a second potential set means for initializing the potential of the current input node NB of the current mirror 135 to LOW (i.e., ground level).

The third and fourth PMOS transistors 124 and 125 together form a current supply circuit 134. The current supply circuit 134 supplies the current input node NB of the current mirror 135 with current when either one of the bit line pair BL and XBL has a potential lower than a difference of $V_{dd}-V_{tp}$. Note that $V_{tp}$ is the PMOS transistor threshold voltage.

The second PMOS transistor 122 and the first NMOS transistor 123 together Form a current control circuit 133. The current control circuit 133 determines the amount of current to be supplied from the current supply circuit 134 to the current mirror 135 if the read control signal Re becomes HIGH. The current control circuit 133 also cuts off the supply of current from the current supply circuit 134 to the current mirror 135 when the potential of the output node NA is reduced by the current mirror 135 to LOW.

The read operation of an SRAM (see FIGS. 1 and 2 for the structure) is explained by making reference to FIG. 3a-d.

At time T0, each timing control circuit 106 provides the high-level word line control signal WC and the high-level switch control signal SC. The output of the OR gate 108 is HIGH, and each switch circuit 103 conducts. Both the bit line pair BL, XBL and the data line pair DL, XDL are precharged by the precharge circuit 102 to HIGH ($V_{dd}$). At this point in time, within the timing control circuit 106, the logic level of the read control signal Re becomes LOW in response to the high-level clock signal CK. This causes only the first PMOS transistor 121 and the first and fourth NMOS transistors 123 and 128 to conduct. No current is applied to the current input node NB of the current mirror 135 From the current supply circuit 134, and, in addition, the potential of the current input node NB is reduced, by the fourth NMOS transistor 128, down to ground level. As a result, neither the second NMOS transistor 126 nor the third NMOS transistor 127 conducts at all. This ensures that the potential of the output node NA becomes HIGH.

When time T1 is reached, the clock signal CK makes a level transition to LOW and a read cycle begins. The precharge circuit 102 is made inactive. Within the timing control circuit 106, the read control signal Re makes a level transition to HIGH and this turns the first PMOS transistor 121 off, the second PMOS transistor 122 on, and the fourth NMOS transistor 128 off. Meanwhile, in response to the output of the row decoder 104, the AND gate 105 commences activating the word line WL. In each column, the potential of one of the bit line pair BL and XBL that is selected according to the data stored in the memory cell 101 (e.g., the potential of the bit line BL of FIG. 3c) drops gradually from $V_{dd}$. The potential of the data line DL likewise drops.

When time T2 is reached, both the potential of the bit line BL and the potential of the data line DL fall down to a difference of $V_{dd}-V_{tp}$. Then, within the timing control circuit 106, the third PMOS transistor 124 is turned on. As a result, a current is supplied to the current input node NB of the current mirror 135 from the power supply by way of the second PMOS transistor 122, the first NMOS transistor 123, and the third PMOS transistor 124. At this point in time, within the current mirror 135, drain current flows through the second and third NMOS transistors 126 and 127 to reduce the potential of the output node NA to LOW. If, in a certain column, the potential of the output node NA within the timing control circuit 106 becomes LOW, then the low-level word line control signal WC and the low-level switch control signal SC are output from the timing control circuit 106. The switch circuit 103 of the column is made open, and the sense amplifier 107 and the data line pair DL and XDL are immediately separated from the bit line pair BL and XBL. As a result of such arrangement, even if the sense amplifier 107 that is made active greatly lowers the potential of the data line DL (see FIG. 3d) so as to make the potential of the data line pair DL and XDL definite, this will not allow the sense amplifier 107 to lower the potential of the bit line BL. If the potential of the output node NA within the timing control circuit 106 comes to LOW, this turns the first NMOS transistor 123 off, thereby cutting off the supply of current to the current mirror 135.

When time T3 is reached, all of the timing control circuits 106 provide the low-level word line control signals WC. Then, the level of the output of the OR gate 108 changes to LOW, and the AND gate 105 stops making the word line WL active in order that all the memory cells 101 are separated from their corresponding bit line pairs BL and XBL. Because of this, after time T3 the drop in the potential of the bit line BL will not take place (see FIG. 3c).

In the present embodiment, before the output potential of the sense amplifier 107 becomes definite and at a point in time when the potential of one of the bit line pair (i.e., the bit line BL) falls to such an extent that the sense amplifier 107 becomes operatable (i.e., below a difference of $V_{dd}-V_{tp}$), both the memory cell 101 and the sense amplifier 107 are separated from the bit line pair BL and XBL. Because of such arrangement, the drop in the potential of the bit line BL is suppressed more successfully compared with conventional techniques, therefore reducing power consumption. Additionally, making the switch circuit 103 free relieves the sense amplifier 107 of load and speeds up the establishment of the output potential of the sense amplifier 107.

The present embodiment uses a way in which, within the timing control circuit 106, the fourth NMOS transistor 128 is used to initialize the potential of the current input node NB of the current mirror 135 to LOW, so that even if the current mirror 135 is assigned a greater mirror ratio this will not produce the problem that the second NMOS transistor 126 is kept at the on state. In cases where the current mirror 135 is not given a great mirror ratio, it is possible not to provide the fourth NMOS transistor 128.

The current mirror 135 may be formed by two NPN-type bipolar transistors.

EXAMPLE 2

Figure 4:
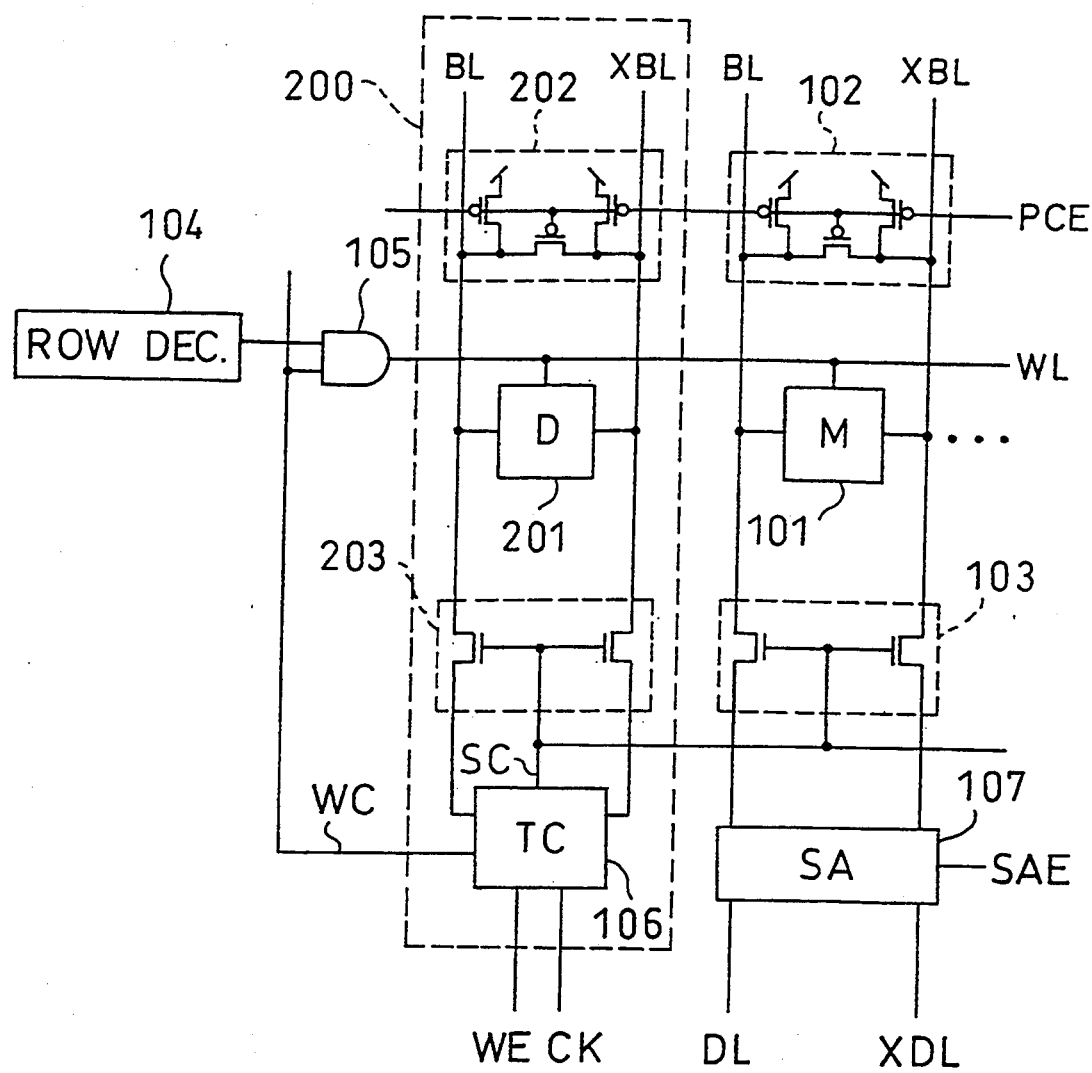
FIG. 4 schematically shows a second semiconductor memory of the present invention.

FIG. 4 is a circuit diagram of a CMOS SRAM of the second embodiment of the present invention. FIG. 4 shows an organization in which the word line control signal WC and the switch control signal SC are acquired from a dummy column 200. The dummy column 200 comprises a dummy cell 201, a dummy bit line pair of BL and XBL, a dummy precharge circuit 202, a dummy switch circuit 203, and the timing control circuit 106. The dummy cell 201 and the memory cell 101 are coupled to the word line WL. The word line control signal WC from the timing control circuit 106 is directly applied to the AND gate 105 for word line control. The switch control signal SC is fed to the dummy switch circuit 203 within the dummy column 200, and to the switch circuits 103 of different columns.

With the present embodiment, the same effects that the organization of FIG. 1 achieves can be obtained, with holding layout areas as small as possible.

EXAMPLE 3

Figure 5:
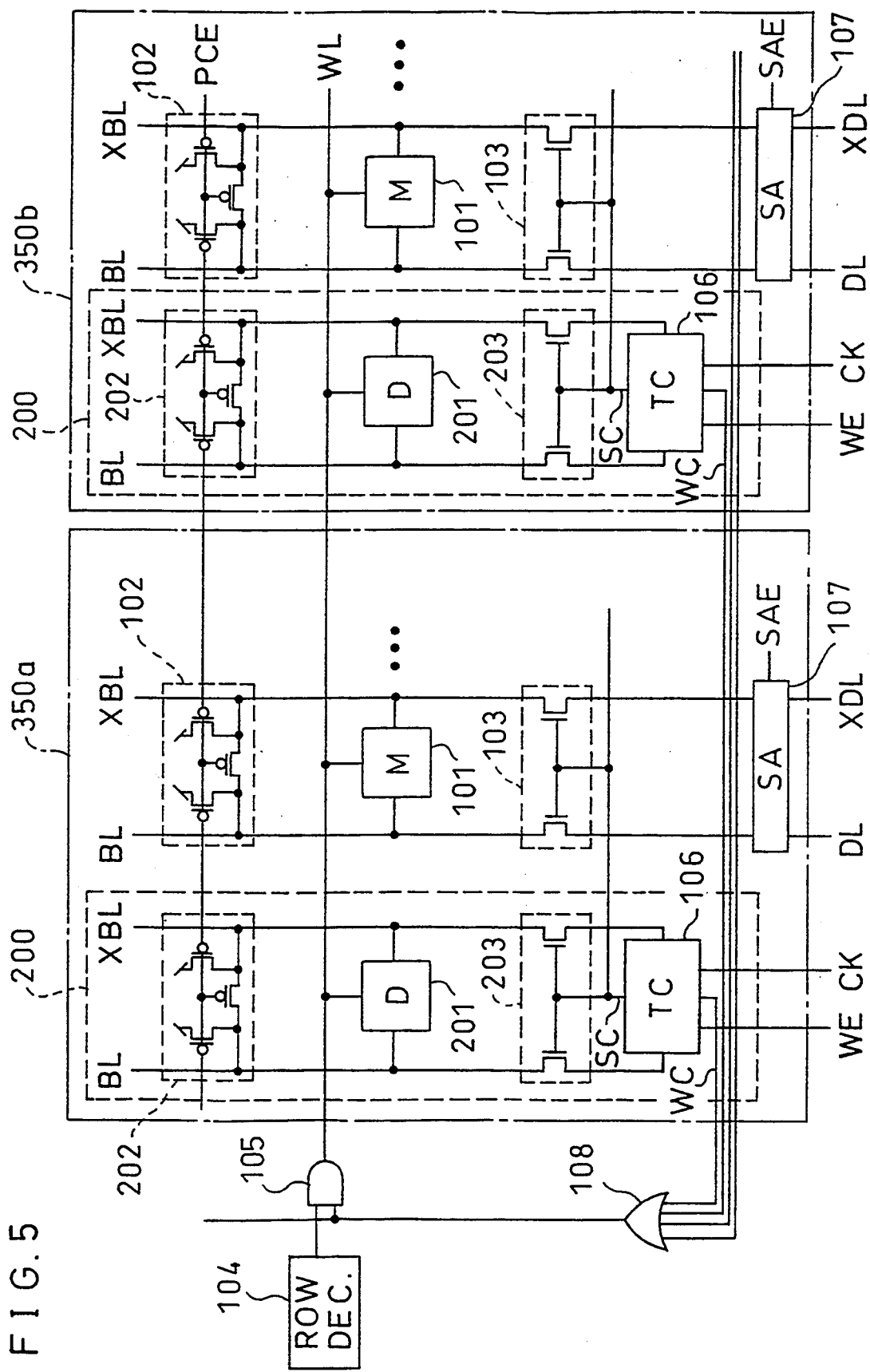
FIG. 5 schematically shows a third semiconductor memory of the present invention.

FIG. 5 shows a CMOS SRAM of the third embodiment of the present invention. FIG. 5 shows an organization in which the word line control signal WC and the switch control signal SC are obtained from the dummy column 200 arranged in each memory block. In FIG. 5, reference numerals 350a and 350b respectively INDICATE A FIRST memory block and a second memory block. The word line control signal WC from the timing control circuit 106 within the dummy column 200 is applied to the AND gate 105 through the OR gate 108 for word line control. The switch control signal SC is applied to the dummy switch circuit 203 in the same memory block, and to the switch circuits 103 of different columns.

The present embodiment relieves the timing control circuit 106 of load, so that, while making the switch circuit 103 free at high speed, the same effects that the organization as shown in FIG. 4 achieves can be obtained.

EXAMPLE 4

Figure 6:
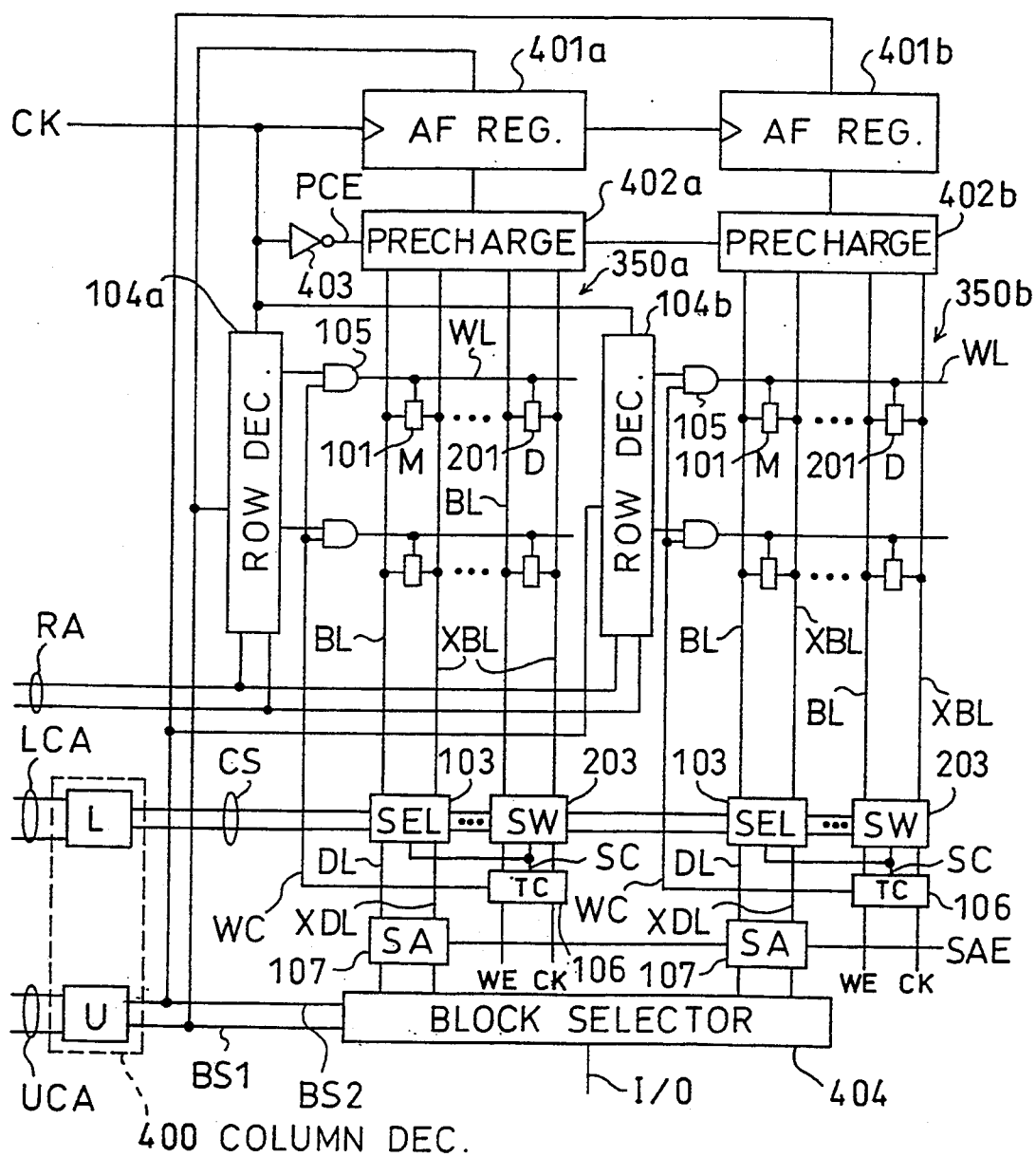
FIG. 6 schematically shows a fourth semiconductor memory of the present invention.

FIG. 6 shows a CMOS SRAM of the fourth embodiment of the present invention. FIG. 6 shows an organization in which the organization of FIG. 4 is employed for every memory block. In FIG. 6, the first and second memory blocks 350a and 350b are shown. A first row decoder 104a and a first precharge circuit 402a are provided with respect to the first memory block 350a, while a second row decoder 104b and a second precharge circuit 402b are provided with respect to the second memory block 350b. The same row address RA is given to the first and second row decoders 104a and 104b. An inverter 403 is provided which applies the reverse of the clock signal CK, as the precharge enable signal PCE, to the first and second precharge circuits 402a and 402b. In each of the memory blocks 850a an 850b, each column has the switch circuit 103 and the data line pairs DL and XDL of the switch circuits 103 are connected to the single sense amplifier 107. Each switch circuit performs the functions of separating the sense amplifier 107 from the bit line pair BL and XBI in response to the switch control signal SC from the timing control circuit 106 and of acting also as a column selector. Each of the sense amplifiers 107 in all the memory blocks is connected to a single block selector 404.

The SRAM of FIG. 6 has a column decoder 400, a first access flag register 401a, and a second access flag register 401b. The clock signal CK is applied to the first access flag register 401a, to the second access flag register 401b, to the first row decoder 104a, and to the second row decoder 104b. The column decoder 400 generates a first block selection signal BS1 and a second block selection signal BS2 from an upper column address UCA and also generates a plurality of column selection signals CS from a lower column address LCA. The first block selection signal BS1 is a signal to select the first memory block 350a, which is applied to the block selector 404, to the first row decoder 104a, and to the first access flag register 401a. The second block selection signal BS2 is a signal to select the second memory block 350b, which is applied to the block selector 404, to the second row decoder 104b, and to the second access flag register 401b. The column selection signals CS are applied to each switch circuit 103 and to each dummy switch circuit 203.

Next, a read operation of the SRAM of FIG. 6 is explained by taking such an example in which data is read out from a memory cell 101 in the first memory block 350a at an access cycle.

When an input address becomes valid, this causes the column decoder 400 to generate the block selection signals BS1 and BS2 and the column selection signals CS. Whereas the first block selection signal BS1 is made active to become HIGH, the second block selection signal BS2 is made inactive to become LOW. In the first memory block 350a, one of the switch circuits 103 and the dummy switch circuit 203 conduct in response to the column selection signals CS.

If the clock signal CK changes to LOW, the first row decoder 104a in receipt of the high-level first block selection signal BS1 makes a word line WL active through the AND gate 105. After this, the timing control circuit 106 outputs the word line control signal WC and the switch control signal SC, before the output of the sense amplifier 107 becomes definite and at a point in time when the potential of every bit line pair BL and XBL in the first memory block 350a changes to such an extent that the sense amplifier 107 becomes operatable. This is described in detail as follows. When the potential of one of the dummy bit line pair BL and XBL connected to the dummy cell 201 in the first memory block 350a falls down to a difference of $V_{dd-Vtp}$, this causes the timing control circuit 106 to send out the low-level word line control signal WC and the low-level switch control signal SC. The AND gate 105 stops activating the word line WL so as to immediately separate the memory cells 101 and the single dummy cell 201 from the bit line pair BE and XBL. The switch circuit 103 and the dummy switch circuit 203 that have been conducted immediately enter the off state to separate the sense amplifier 107 from the bit line pair BL and XBL. The sense amplifier 107 keeps amplifying, and data, read out from a memory cell 101 in the first memory block 350a, is output through the block selector 404.

When the clock signal CK returns back to HIGH, the block selection signals BS1 and BS2 are respectively stored in the first and second access flag registers 401a and 401b. In the above-described case, the first block selection signal BS1 is HIGH and the second block selection signal BS2 is LOW, so that a 1 is stored in the first access flag register 401a and a 0 is stored in the second access flag register 401b. The first precharge circuit 402a performs precharge operations according to the precharge enable signal PCE only when the first access flag register 401 holds a "1". With regard to the second precharge circuit 02b, its precharge operations are permitted or inhibited according to the stored data in the second access flag register 401b. Therefore, of these two precharge circuits only the first precharge circuit 402a performs precharge operations, as a result of which only the bit line pair and the dummy bit line pair in the first memory block 350a accessed at the most recent cycle are precharged to HIGH. On the other hand, the bit line pair and the dummy bit line pair in the second memory block 350b that have not been accessed stay HIGH although the second precharge circuit 402b does not work. Every bit line pair and every dummy line pair in the first and second memory blocks 350a and 350b are now precharged to HIGH, and they all wait for the next access.

In the present embodiment, the activation of the word line WL is controlled. Because of this arrangement, the same effects that the organization of FIG. 4 achieves can be accomplished while at the same time reducing an unwanted drop in the bit line potential. Additionally, selection between the precharge circuits 402a and 402b is made on the basis of the input address information concerning the most recent access. Therefore, even if the establishment of the next input address is delayed it is possible to start precharge operations early.

EXAMPLE 5

Figure 7:
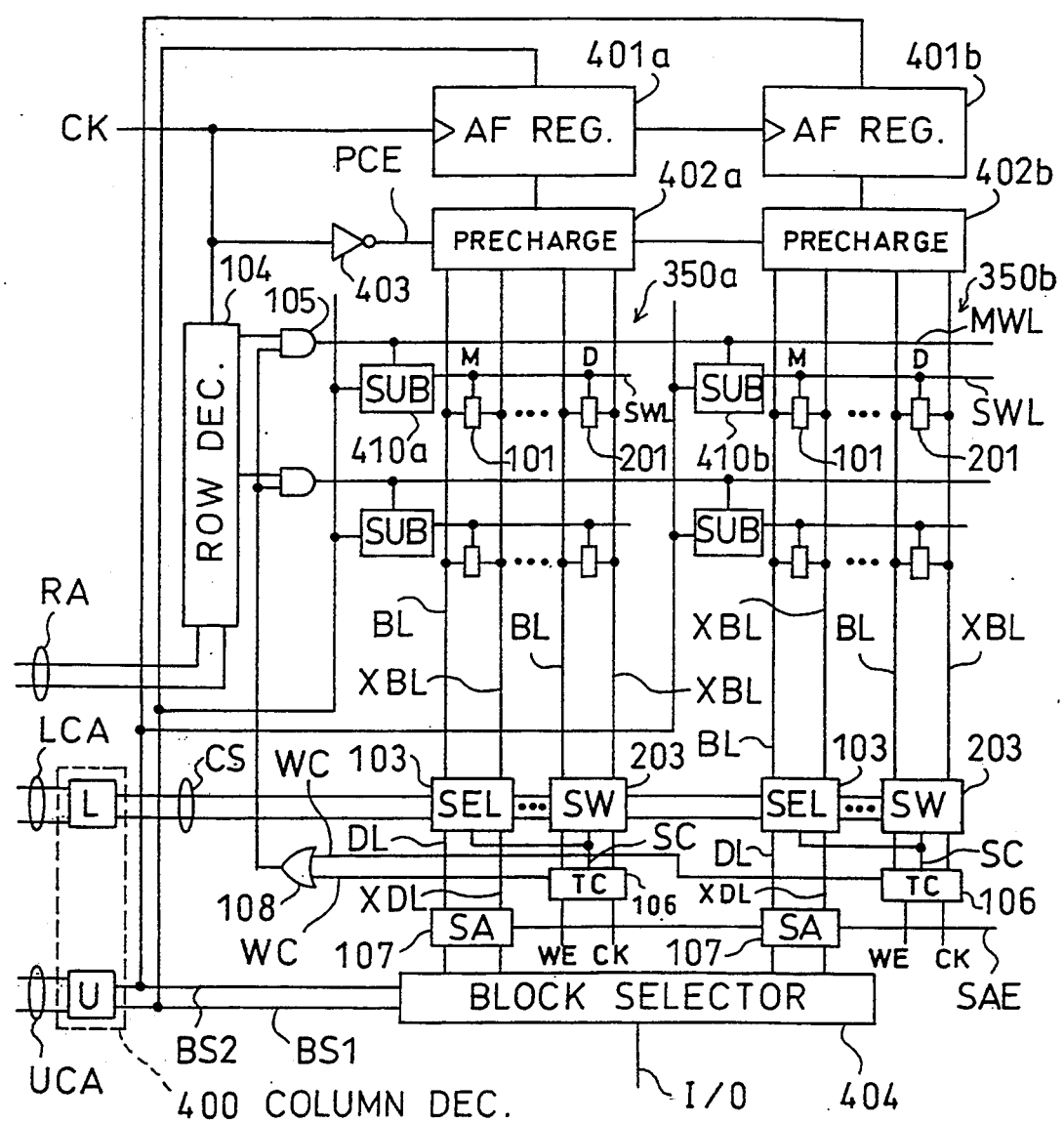
FIG. 7 schematically shows a fifth semiconductor memory of the present invention.

FIG. 7 is a circuit diagram showing a CMOS SRAM of the fifth embodiment of the present invention. FIG. 7 illustrates a modification of FIG. 6 in order to make use of the organization of FIG. 5 that employs the OR gate 108. In the present embodiment, the row decoder 104 and a main word line MWL are shared between the first and second memory blocks 350a and 350b. The row decoder 104 selectively makes one particular main word line MWL active through the AND gate 105. A sub-decoder 410a is provided which makes a sub-word line SWL of the first memory block 350a active, subject to the activation of the main word line MWL and the first block selection signal BS1. A sub-decoder 410b is provided which makes a sub-word line SWL of the second memory block 350b active, subject to the activation of the main word line MWL and the second block selection signal BS2. Each sub-decoder may be formed by a 2-input AND gate.

In the present embodiment, the activation of the sub-word line SWL is controlled. Because of this arrangement, the same effects that the organization of FIG. 5 offers can be accomplished while at the same time reducing an undesired drop in the bit line potential. Even if the establishment of the next input address is delayed it is possible to start precharge operations early. This is the same as the organization of FIG. 6.

This invention may applicable in semiconductor memories other than CMOS SRAMs and in cases where a single bit line is connected to each memory cell. The memory block count in FIGS. 5-7 may be three or more.

The invention claimed is:
1. A semiconductor memory comprising:
   (a) a plurality of memory cells for storing respective bits of data,
   (b) a word line connected in common to said plurality of memory cells,
   (c) a plurality of bit lines connected to the corresponding memory cells,
   (d) precharge means for charging each bit line to a predefined precharge level,
   (e) an amplifier connected to said plurality of bit lines to amplify changes in the potential of said plurality of bit lines on the basis of the bits of data stored in said plurality of memory cells when said word line is made active,
   (f) sense means for providing a first sense signal and a second sense signal, before the output of said amplifier becomes definite and at the latest at a point in time when the potential of said plurality of bit lines changes to such an extent that said amplifier becomes operatable,
   (g) control means for making said word line inactive to separate said plurality of memory cells from the corresponding bit lines according to said first sense signal from said sense means, and

(h) switch means for separating said amplifier from said plurality of bit lines according to said second sense signal from said sense means.

2. A semiconductor memory as in claim 1, wherein said sense means comprises:
   (a) first potential set means for initializing the potential of an output node of said first sense signal and said second sense signal,
   (b) current mirror means having a current input terminal and a current output terminal that is connected to said output node so as to change the potential of said output node if a current is applied to said current input terminal,
   (c) current supply means for supplying said current mirror means with a current through said current input terminal when the potential of a corresponding bit line changes to such an extent that said amplifier becomes operatable, and
   (d) current control means for controlling the supply of current from said current supply means to said current mirror when the potential of said output node changes.

3. A semiconductor memory as in claim 2, wherein said sense means further includes second potential set means for initializing the potential of said current input terminal of said current mirror means.

4. A semiconductor memory as in claim 1, wherein said sense means includes:
   (a) a plurality of timing control circuits connected to said plurality of bit lines for detecting a change in the potential of a corresponding bit line, and
   (b) a logic circuit for providing said first sense signal when all the timing control circuits detect changes in the potential of the corresponding bit lines.

5. A semiconductor memory as in claim 1, said semiconductor memory further including:
   (a) a dummy cell connected to said word line,
   (b) a dummy bit line connected to said dummy cell, and
   (c) dummy precharge means for charging said dummy bit line to a predefined precharge level, and said sense means including:
   (d) a timing control circuit that is connected to said dummy bit line, whereby said first sense signal is provided if changes in the potential off said plurality of bit lines are indirectly detected through detecting a change in the potential of said dummy bit line.

6. A semiconductor memory as in claim 1, said semiconductor memory further including:
   (a) a plurality of dummy cells connected in common to said word line,
   (b) a plurality of dummy bit lines connected to the corresponding dummy cells, and
   (c) dummy precharge means for charging each dummy bit line to a predefined precharge level, wherein said plurality of memory cells are divided into a plurality of memory blocks and each dummy cell belongs to a memory block, and said sense means including:
   (d) a plurality of timing control circuits connected to the corresponding dummy bit lines, whereby changes in the potential of a plurality of dummy bit lines within a corresponding memory block are indirectly detected through detecting a change in the potential of a corresponding dummy bit line, and
   (e) a logic circuit for providing said first sense signal when all the timing control circuits detect changes in the potential of the corresponding dummy bit lines.

7. A semiconductor memory comprising:
   (a) a plurality of memory blocks,
   (b) selection means for selecting one from among said plurality of memory blocks according to column address information, and
   (c) storage means for storing access information indicative of which one of said plurality of memory blocks has been selected by said selection means at the most recent access cycle, and
   each memory block including:
   (d) a plurality of memory cells for storing respective bits of data,
   (e) a word line connected in common to said plurality of memory cells,
   (f) a plurality of bit lines connected to the corresponding memory cells,
   (g) activation means for making said word line active on the assumption that said activation means belongs to a memory block selected by said selection means, and
   (h) precharge means for charging each bit line to a predefined precharge level on the assumption that said precharge means belongs to a memory block represented by said access information stored in said storage means.

8. A semiconductor memory as in claim 7 further including:
   (a) an amplifier connected to said plurality of bit lines to amplify changes in the potential of said plurality of bit lines on the basis of the bits of data stored in said plurality of memory cells when said word line is made active,
   (b) sense means for providing a first sense signal and a second sense signal, before the output of said amplifier becomes definite and at the latest at a point in time when the potential of said plurality of bit lines changes to such an extent that said amplifier becomes operatable,
   (c) control means for making said word line inactive to separate said plurality of memory cells from the corresponding bit lines according to said first sense signal from said sense means, and
   (d) switch means for separating said amplifier from said plurality of bit lines according to said second sense signal from said sense means.

9. A semiconductor memory comprising:
   (a) a plurality of memory blocks,
   (b) a main word line arranged across said plurality of memory blocks,
   (c) a decoder for decoding row address information to make said main word line active,
   (d) a selector for selecting one from among said plurality of memory blocks according to column address information,
   (e) storage means for storing access information indicative of which one of said plurality of memory blocks has been selected by said selection means at the most recent access cycle, and
   each memory block including:
   (f) a plurality of memory cells for storing respective bits of data,
   (g) a sub-word line connected in common to said plurality of memory cells, (h) a plurality of bit lines connected to the corresponding said memory cells, (i) activation means for making said sub-word line active on the assumption that said activation means belongs to a memory block selected by said selection means and that said main word line is made active, and (h) precharge means for charging each bit line to a predefined precharge level on the assumption that said precharge means belongs to a memory block represented by said access information stored in said storage means.

10. A semiconductor memory as in claim 9 further including:

(a) an amplifier connected to said plurality of bit lines to amplify changes in the potential of said plurality of bit lines on the basis of the bits of data stored in said plurality of memory cells when said sub-word line is made active, (b) sense means for providing a first sense signal and a second sense signal, before the output of said amplifier becomes definite and at the latest at a point in time when the potential of said plurality of bit lines changes to such an extent that said amplifier becomes operatable, (c) control means for making said main word line inactive to separate said plurality of memory cells from the corresponding bit lines according to said first sense signal from said sense means, and (d) switch means for separating said amplifier from said plurality of bit lines according to said second sense signal from said sense means.

* * * * *